(12) United States Patent
Polnyi et al.

(10) Patent No.: US 7,833,022 B2
(45) Date of Patent: Nov. 16, 2010

(54) LGA SOCKET HAVING ALIGNMENT POSTS WITH CRASH RIBS

(75) Inventors: Igor Polnyi, Aurora, IL (US); Fang-Jwu Liao, Tu-cheng (TW); Chun-Yi Chang, Tu-cheng (TW)

(73) Assignee: Hon Hai Precision Ind. Co., Ltd., Taipei (TW)

( * ) Notice: Subject to any disclaimer, the term of this patent is extended or adjusted under 35 U.S.C. 154(b) by 138 days.

(21) Appl. No.: 12/317,956

(22) Filed: Dec. 31, 2008

(65) Prior Publication Data

US 2010/0167562 A1 Jul. 1, 2010

(51) Int. Cl.
*H01R 12/00* (2006.01)
(52) U.S. Cl. .................. 439/71; 439/331; 439/330; 439/352
(58) Field of Classification Search ........... 439/330, 439/71, 352, 73, 350, 525, 526, 66, 72, 91, 439/331, 573, 564
See application file for complete search history.

(56) References Cited

U.S. PATENT DOCUMENTS

| | | | |
|---|---|---|---|
| 6,375,476 B1 * | 4/2002 | Goodwin et al. | 439/71 |
| 6,699,047 B1 * | 3/2004 | McHugh et al. | 439/71 |
| 6,702,588 B1 * | 3/2004 | McHugh et al. | 439/71 |
| 7,547,216 B1 * | 6/2009 | Polnyl et al. | 439/68 |
| 7,648,382 B1 * | 1/2010 | Polnyi | 439/330 |

* cited by examiner

*Primary Examiner*—Edwin A. Leon
(74) *Attorney, Agent, or Firm*—Andrew C. Cheng; Wei Te Chung; Ming Chieh Chang

(57) ABSTRACT

An LGA socket includes an insulative housing and a plurality of electrical contacts secured on the insulative housing. The insulative housing defines a top face and a bottom face opposite to each other. The insulative housing has a number of alignment posts at corners and the alignment posts together form a receiving space. The alignment post is provided with two crash ribs for positioning an integral module received in the receiving space.

10 Claims, 4 Drawing Sheets

LGA SOCKET HAVING ALIGNMENT POSTS WITH CRASH RIBS

BACKGROUND OF THE INVENTION

1. Field of the Invention

The present invention relates to an LGA (land grid array) socket having alignment posts at corners and on which an integrated circuit (IC) package is mounted. And more particularly, the alignment posts each is provided with crash ribs ensuring securely retaining of the IC mounted thereon.

2. Description of Related Art

Conventional LGA socket are provided to establish electrical connection between an integral circuit and a printed circuit board, and include an insulative housing and a number of electrical contacts secured on the insulative housing. The insulative housing has a base and a plurality of peripheral walls extending upwardly from the base. The base defines a number of through holes for receiving the electrical contacts. The peripheral walls define a receiving space for accommodating the integral circuit. Generally, two adjacent peripheral walls define an alignment device for ensuring the integrated circuit at a proper position. The alignment device may be two spring arms on the adjacent peripheral walls and the spring arms each is split from the corresponding wall and provided a datum plane for the integrated circuit.

BRIEF SUMMARY OF THE INVENTION

An object of the present invention is to provide an LGA socket having alignment posts with crash ribs.

An LGA socket includes an insulative housing and a plurality of electrical contacts. The insulative housing has a top face and a bottom face opposite thereto and defines a plurality of passageways extending from the top face to the bottom face for receiving the contacts. The insulative housing includes a plurality of alignment posts at corners thereof and the alignment posts define a receiving space therebetween. Each alignment post comprises at least two crash ribs facing to the receiving space.

Other advantages and novel features of the present invention will become more apparent from the following detailed description when taken in conjunction with the accompanying drawings, in which:

DETAILED DESCRIPTION OF THE PREFERRED EMBODIMENT

Figure 1:
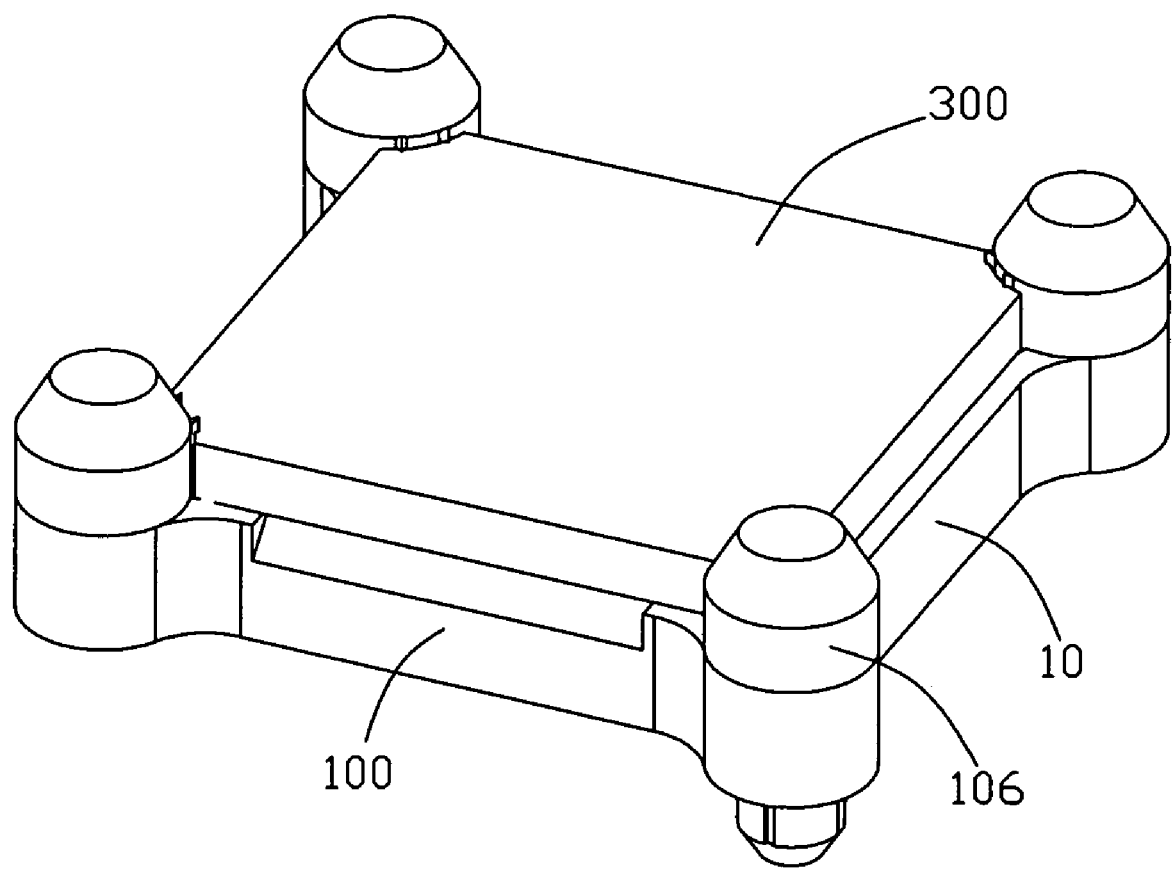
FIG. 1 is an assembly view of an LGA socket in accordance with a preferred embodiment of the present invention with an integral module mounted thereon.
Figure 2:
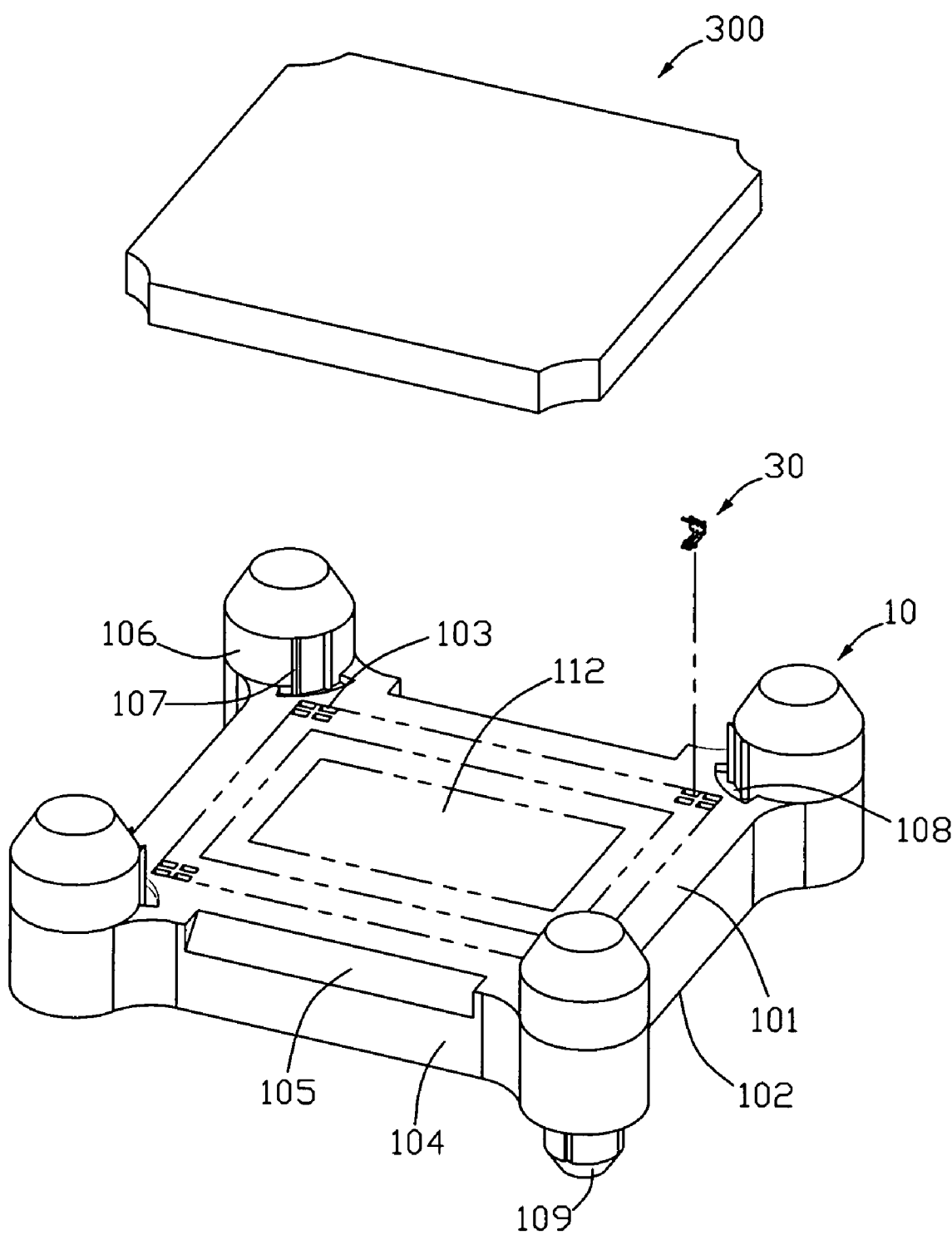
FIG. 2 is an exploded perspective view of the LGA socket and the integral module shown in FIG. 1.
Figure 3:
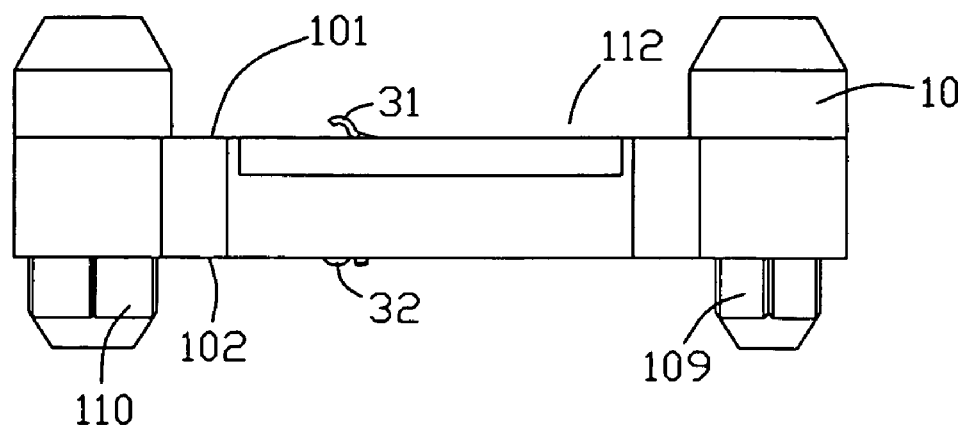
FIG. 3 is a side view of the LGA socket shown in FIG. 1.
Figure 4:
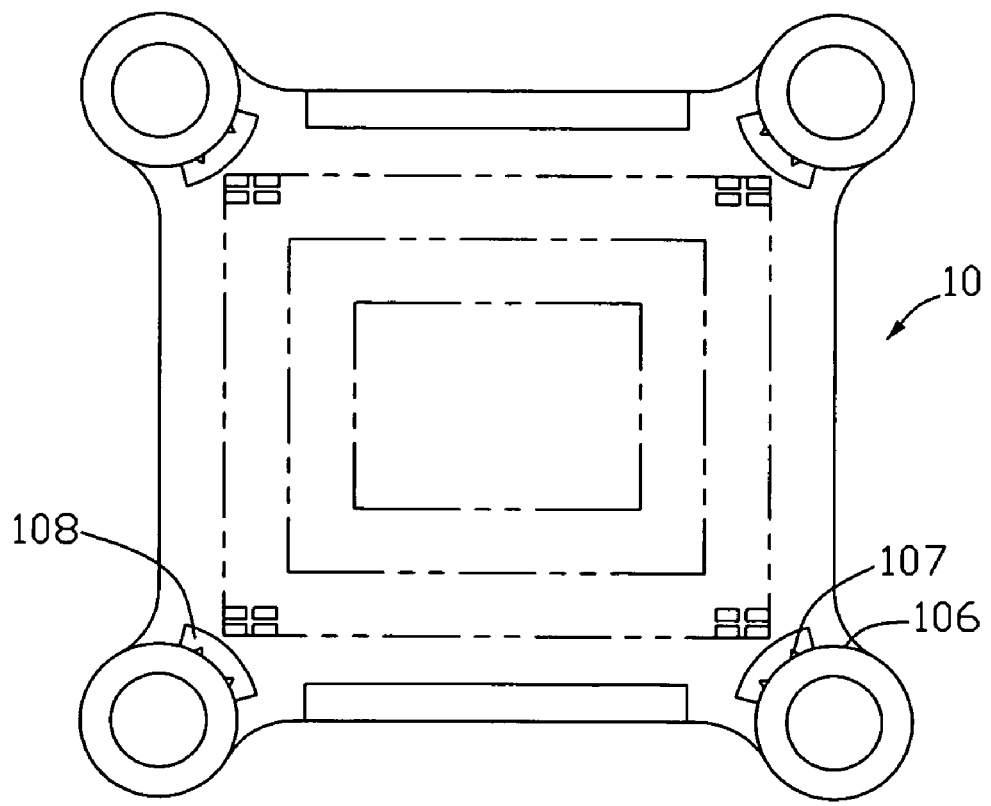
FIG. 4 is a top view of the insulative housing shown in FIG. 1.

Hereinafter, a preferred embodiment of the invention will be described in detail with reference to the attached drawings.

Referring to FIGS. 1 to 4, an LGA socket 100 for carrying an integrated module 300 to be electrically connected to a printed circuit board (not shown). The LGA socket 100 comprises an insulative housing 10 and a plurality of electrical contacts 30 attached to the insulative housing 10.

The insulative housing has a top face 101, a bottom face 10 opposite to the top face 101, and a plurality of side faces 104. The insulative housing 10 defines a plurality of passageways 103 extending from the top face 101 to the bottom face 102 for receiving the electrical contacts 30. The insulative housing 10 defines two recesses 105 formed on two opposite sides thereof, and each recess 105 opens to the top face 101 and a corresponding side face 104 of the insulative housing 10.

The electrical contacts 30 each have a top contact section 31 for electrical contacting with the integral module 300 and a bottom contact section 32 for mounting to the printed circuit board. The contact sections 31, 32 of the electrical contact 30 are extending out of the top and bottom face 101, 102 of the insulative housing 10, respectively.

The insulative housing 10 includes a plurality of cylindrical alignment posts 106 at corners thereof. The alignment posts 106 together forms a receiving space 112 for receiving the integral module 300 therein. Each alignment post 106 defines at least two crash ribs 107 facing to the receiving space 112. The insulative housing 10 defines a plurality of grooves 108 on the top face 101, and the grooves 108 are arranged close to the intersect positions of the alignment posts 106 and the top face 101.

The insulative housing 10 further includes two cylindrical positioning posts 109, 110 extending from the bottom face 102 thereof and the positioning posts 109, 110 are located on the diagonal corners of the insulative housing 10. The positioning post 110 is larger than the positioning post 109. The positioning post 109, 110 are inserted into the corresponding holes (not shown) on the printed circuit board thereby positioning the LGA socket 100 with respect to the printed circuit board.

When inserting the integral module 300 onto the LGA socket 100, each corner of the integral module 300 has a certain interference with the crash ribs 107 of alignment post 106, which could hold the integral module 300 with retention force. In the same time, the top face 101 of the insulative housing 10 is confronting the integral module 300 and the bottom face is face to the printed circuit board. The electrical contacts 30 are contacting with the integral module 300 and printed circuit board.

Figure 5:
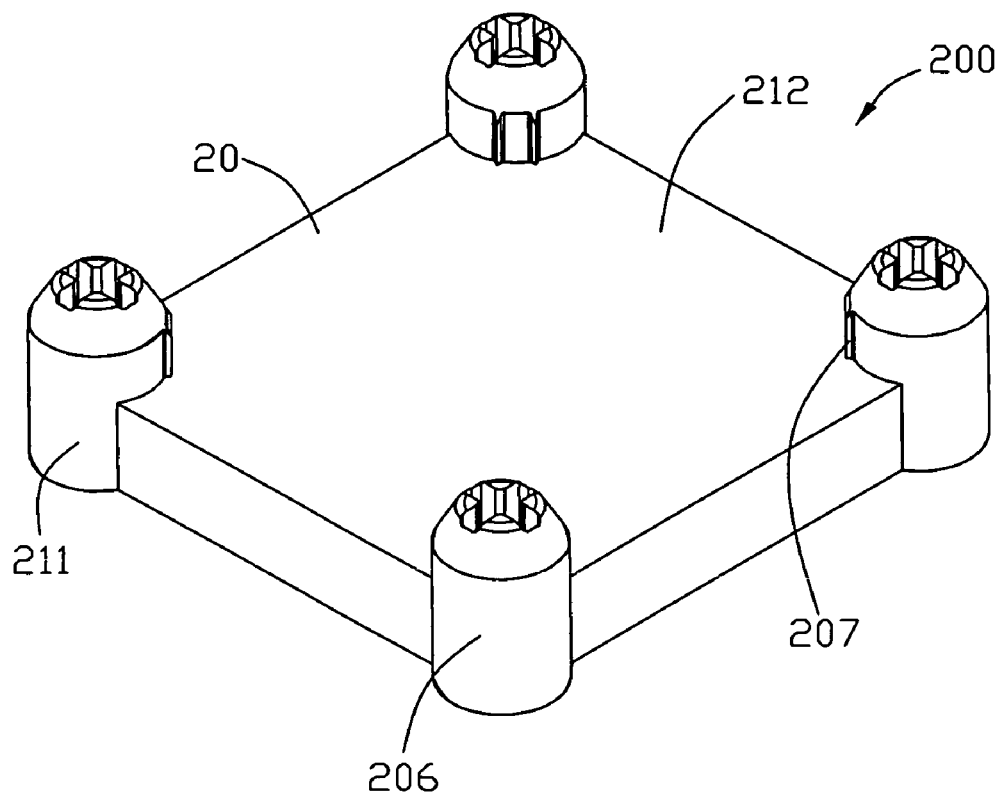
FIG. 5 is an exploded isometric view of an LGA socket in accordance with a second embodiment of the present invention.
Figure 6:
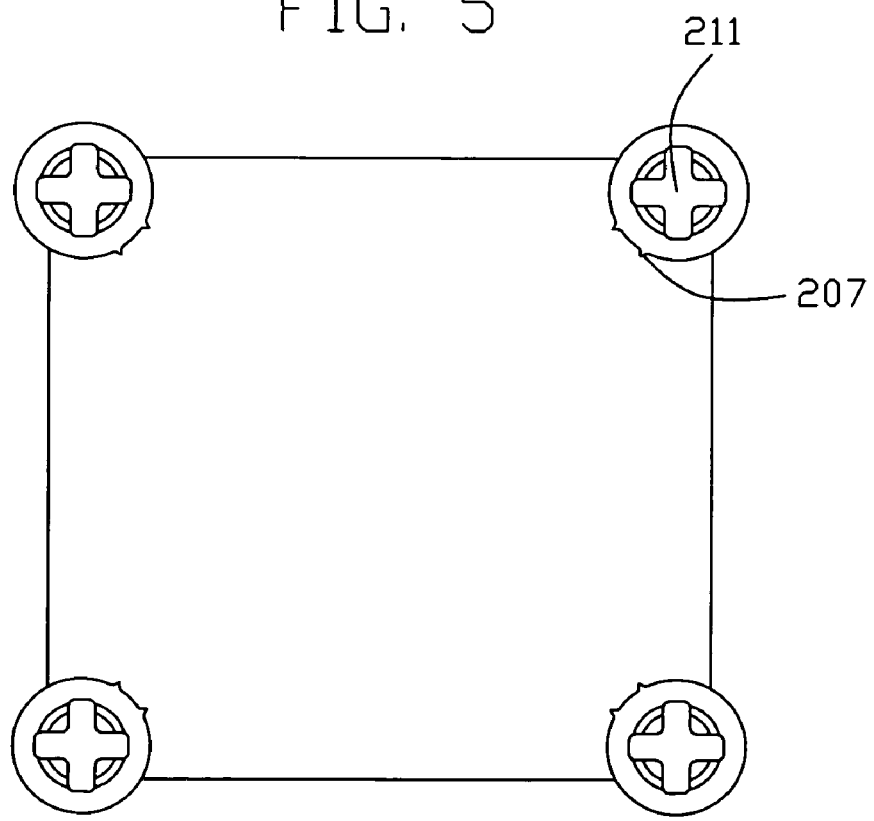
FIG. 6 is a top view of the LGA socket shown in FIG. 5.

FIGS. 5 to 6 show a second embodiment according to the present invention. The electrical connector 200 is similar to the electrical connector 100 except the alignment posts 206 of the insulative housing 20. Each alignment post 206 defines at least two crash ribs 207 facing to the receiving space 212. Each alignment post 206 defines a central cross-shaped hole 211 so that the alignment post 206 has a good elasticity. Thus, the abrasion of the alignment post 206 can be reduced.

Furthermore, although the present invention has been described with reference to particular embodiments, it is not to be construed as being limited thereto. Various alterations and modifications can be made to the embodiments without in any way departing from the scope or spirit of the present invention as defined in the appended claims.

We claim:

1. An LGA socket for connecting an integral module with a printed circuit board, comprising: an insulative housing having a top face and a bottom face opposite thereto, the insulative housing defining a plurality of passageways extending from the top face to the bottom face; and a plurality of electrical contacts received in the passageways of the insulative housing; the insulative housing including a plurality of alignment posts at corners thereof, said alignment posts defining a receiving space receiving the integrated module therebetween and each alignment posts including at least two crash ribs facing to the receiving space, said two crash ribs causing interference with at least two corners of the integral module, wherein each alignment posts defines a cross-shaped central hole.

2. The LGA socket as claimed in claim 1, wherein the insulative housing further includes two positioning posts extending from the bottom face thereof, and wherein said two positioning posts are located on the diagonal corners of the insulative housing.

3. The LGA socket as claimed in claim 2, wherein said two positioning posts are cylinder and one positioning post of said two positing posts is larger than the other.

4. The LGA socket as claimed in claim 1, wherein each electrical contact comprises contact sections extending out of the top and bottom face of the insulative housing, respectively.

5. The LGA socket as claimed in claim 1, wherein the insulative housing defines two recesses formed on two opposite sides, and the recesses are open to the top face and a corresponding side face of the insulative housing.

6. The LGA socket as claimed in claim 1, wherein said alignment posts each have a cylinder configuration.

7. The LGA socket as claimed in claim 6, wherein the insulative housing defines a plurality of grooves on the top face, and the grooves are arranged close to the intersect positions of the alignment posts and the top face.

8. An LGA socket for connecting an integral module with a printed circuit board, comprising: an insulative housing having a top face confronting the integral module and a bottom face confronting the printed circuit board, and a plurality of electrical contacts received in the passageways of the insulative housing; the insulative housing including a plurality of alignment posts at corners thereof defining a receiving space receiving the integrated module therebetween, each of the alignment posts defining a cross-shaped central hole, each alignment posts including at least two crash ribs facing to the receiving space, said two crash ribs causing interference with at least two corners of the integral module.

9. The LGA socket as claimed in claim 8 wherein said alignment posts each have a cylinder configuration.

10. The LGA socket as claimed in claim 8, wherein said alignment posts defines a receiving space therebetween and each alignment posts a plurality of crash ribs facing to the receiving space.

* * * * *